(12) United States Patent
Yano

(10) Patent No.: US 9,070,460 B2
(45) Date of Patent: Jun. 30, 2015

(54) NON-VOLATILE SEMICONDUCTOR MEMORY

(71) Applicant: Winbond Electronics Corp., Taichung (TW)

(72) Inventor: Masaru Yano, Tokyo (JP)

(73) Assignee: Winbond Electronics Corp., Taichung (TW)

(*) Notice: Subject to any disclaimer, the term of this patent is extended or adjusted under 35 U.S.C. 154(b) by 65 days.

(21) Appl. No.: 14/027,926

(22) Filed: Sep. 16, 2013

(65) Prior Publication Data

US 2014/0104950 A1    Apr. 17, 2014

(30) Foreign Application Priority Data

Oct. 12, 2012  (JP) .................................. 2012-226536

(51) Int. Cl.
| | | |
|---|---|---|
| *G11C 11/34* | (2006.01) | |
| *G11C 16/16* | (2006.01) | |
| *G11C 16/10* | (2006.01) | |
| *G11C 16/34* | (2006.01) | |

(52) U.S. Cl.
CPC ............ *G11C 16/16* (2013.01); *G11C 16/3454* (2013.01); *G11C 16/10* (2013.01)

(58) Field of Classification Search
CPC  G11C 16/16; G11C 16/3454; G06F 12/0246; G06F 11/1068
USPC ............ 365/185.03, 185.11, 185.19, 185.22, 365/185.29, 185.3, 230.03
See application file for complete search history.

(56) References Cited

U.S. PATENT DOCUMENTS

| | | | | |
|---|---|---|---|---|
| 8,797,802 | B2* | 8/2014 | Hung et al. ............... | 365/185.19 |
| 8,891,312 | B2* | 11/2014 | Lee et al. ................. | 365/185.24 |
| 2003/0133327 | A1 | 7/2003 | Shimizu et al. | |
| 2005/0052908 | A1 | 3/2005 | Tomoeda et al. | |
| 2010/0124122 | A1 | 5/2010 | Jeong et al. | |

FOREIGN PATENT DOCUMENTS

| | | |
|---|---|---|
| KR | 10-2003-0063083 A | 7/2003 |
| KR | 10-2005-0024248 A | 3/2005 |
| KR | 10-2010-0054705 A | 5/2010 |

OTHER PUBLICATIONS

Korean Office Action Dated Aug. 29, 2014, as Issued In Corresponding Korea Patent Applicaton No. 10-2013-0079950 (with English Translation).

* cited by examiner

*Primary Examiner* — Fernando Hidalgo
(74) *Attorney, Agent, or Firm* — Muncy, Geissler, Olds & Lowe, P.C.

(57) ABSTRACT

A non-volatile semiconductor memory includes a memory array. In a programming operation, programming pulses are applied to a page of the memory array to program data to the page. In an erase operation, erase pulses are applied to a block of the memory array to erase data in the block. The non-volatile semiconductor memory performs a pre-program operation before the erase operation and a post-erase operation after the erase operation. In the pre-program operation, each page of the block is programmed according to voltage information relating programming pulses. In the erase operation, data in the block is erased according to the voltage information relating programming pulses.

17 Claims, 13 Drawing Sheets

| | 07 | 06 | 05 | 04 | 03 | 02 | 01 | 00 | 17 | 16 | 15 | 14 | 13 | 12 | 11 | 10 |
|---|---|---|---|---|---|---|---|---|---|---|---|---|---|---|---|---|
| Vpgm | 17.8 | 17.6 | 17.4 | 17.2 | 17 | 16.8 | 16.6 | 16.4 | 17.8 | 17.6 | 17.4 | 17.2 | 17 | 16.8 | 16.6 | 16.4 |
| WL-31 | 0 | 0 | 0 | 0 | 0 | 1 | 1 | 1 | 1 | 1 | 1 | 1 | 1 | 0 | 0 | 0 |
| WL-30 | 0 | 0 | 0 | 0 | 1 | 1 | 1 | 1 | 1 | 1 | 1 | 1 | 0 | 0 | 0 | 0 |
| WL-29 | 0 | 0 | 0 | 0 | 0 | 1 | 1 | 1 | 1 | 1 | 1 | 1 | 1 | 0 | 0 | 0 |
| WL-28 | 0 | 0 | 0 | 1 | 1 | 1 | 1 | 1 | 1 | 1 | 1 | 0 | 0 | 0 | 0 | 0 |
| WL-27 | 0 | 0 | 0 | 0 | 0 | 1 | 1 | 1 | 1 | 1 | 1 | 1 | 1 | 0 | 0 | 0 |
| WL-26 | 0 | 0 | 0 | 0 | 0 | 0 | 1 | 1 | 1 | 1 | 1 | 1 | 1 | 0 | 0 | 0 |
| WL-25 | 0 | 0 | 0 | 0 | 0 | 0 | 1 | 1 | 1 | 1 | 1 | 1 | 1 | 1 | 0 | 0 |
| Verify | 0 | 0 | 0 | 0 | 0 | 0 | 1 | 1 | 1 | 1 | 1 | 0 | 0 | 0 | 0 | 0 | non-inverted codes (07–00) | inverted codes (17–10)

FIG. 7

| | 07 | 06 | 05 | 04 | 03 | 02 | 01 | 00 | 17 | 16 | 15 | 14 | 13 | 12 | 11 | 10 |
|---|---|---|---|---|---|---|---|---|---|---|---|---|---|---|---|---|
| Vpgm | 17.8 | 17.6 | 17.4 | 17.2 | 17 | 16.8 | 16.6 | 16.4 | 17.8 | 17.6 | 17.4 | 17.2 | 17 | 16.8 | 16.6 | 16.4 |
| WL-31 | 0 | 0 | 0 | 0 | 0 | 0/1 | 1 | 1 | 1 | 1 | 1 | 1 | 1 | 1 | 1 | 1 |
| WL-30 | 0 | 0 | 0 | 0 | 0/1 | 1 | 1 | 1 | 1 | 1 | 1 | 1 | 1 | 1 | 1 | 1 |
| WL-29 | 0 | 0 | 0 | 0 | 0 | 0/1 | 1 | 1 | 1 | 1 | 1 | 1 | 1 | 1 | 1 | 1 |
| WL-28 | 0 | 0 | 0 | 0/1 | 1 | 1 | 1 | 1 | 1 | 1 | 1 | 1 | 1 | 1 | 1 | 1 |
| WL-27 | 0 | 0 | 0 | 0 | 0 | 0/1 | 1 | 1 | 1 | 1 | 1 | 1 | 1 | 1 | 1 | 1 |
| WL-26 | 0 | 0 | 0 | 0 | 0 | 0/1 | 1 | 1 | 1 | 1 | 1 | 1 | 1 | 1 | 1 | 1 |
| WL-25 | 0 | 0 | 0 | 0 | 0 | 0 | 0/1 | 1 | 1 | 1 | 1 | 1 | 1 | 1 | 1 | 1 |
| Verify | NA | NA | NA | NA | NA | NA | NA | NA | NA | NA | NA | NA | NA | NA | NA | NA | non-inverted codes | inverted codes

FIG. 11

NON-VOLATILE SEMICONDUCTOR MEMORY

CROSS REFERENCE TO RELATED APPLICATIONS

This application claims priority of Japan Patent Application No. 2012/226536, filed on Oct. 12, 2012, the entirety of which is incorporated by reference herein.

BACKGROUND OF THE INVENTION

1. Field of the Invention

The invention relates to a non-volatile semiconductor memory device and more particularly to a programming method and an erasing method of a flash memory.

2. Description of the Related Art

A NAND type flash memory comprises a memory array consisting of a plurality of NAND strings arranged in a matrix form. One NAND string comprises a plurality of memory cells connected in serial and select transistors provided at two ends of the NAND string. One end of the NAND string is connected to a bit line through one of the select transistors, and the other end of the NAND string is connected to a source line through the other one of the select transistors.

A conventional memory cell comprises an N-type source, an N-type drain, an oxide film formed on a channel defined between the source and the drain, a floating gate (charge accumulation layer) formed on the oxide film for accumulating charges, and a control gate formed on the floating gate through a dielectric film. When a programming (write-in) operation is performed, a high voltage is applied to the control gate and 0V is applied to the channel. As such, electrons pass through the oxide film by Fowler-Nordheim tunneling (F-N tunneling) and are accumulated in the floating gate. When electrons are accumulated in the floating gate, that is, when data "0" is stored, a threshold value is shifted toward a positive value and the memory cell is normally off. On the other hand, when an erase operation is performed, a high voltage is applied to a P-well region and 0V is applied to the control gate. As such, electrons accumulated in the floating gate pass through the oxide film by F-N tunneling and are pulled to a substrate. When the floating gate doesn't accumulate charges, that is, when data "1" is stored, the threshold value is a negative value and the memory cell is normally on.

As described above, in the programming operation, the floating gate accumulates electrons and the threshold voltage of the memory cell is shifted toward a positive value, while in the erase operation, electrons are released from the floating gate and the threshold voltage of the memory cell is shifted toward a negative value. Therefore, the programming operation and the erase operation have to be controlled so that the threshold value of the memory cell can be within distribution widths of "0" and "1". Moreover, if the memory cell stores multiple bits, the programming operation and the erase operation have to be controlled so that the threshold value of the memory cell can be within distribution widths of "00", "01", "10" and "11".

Nevertheless, since sizes and shapes of memory cells vary according to changes in process parameters and the number of times of programming and erasing is a main cause of deterioration of oxide films, it is not easy to erase data in the memory cells. In other words, in some memory cells, electrons are easy to be released and thus threshold values are easy to be within the threshold value distribution width of "1", while in some other memory cells, electrons are not easy to be released and thus some threshold values may not be within the threshold value distribution width of "1". In view of this, if it is detected by an erase verify operation that there is a memory cell in which electrons are not completely released, the erase voltage has to be applied to the selected block again to make the threshold value of the memory cell be within the threshold value distribution width of "1".

In order to correctly and effectively release electrons from memory cells, an ISPE (Incremental Step Pulse Erase) method is usually used. As shown in FIG. 1A, in the ISPE method, an initial erase pulse Vers0 is applied to memory cells in a selected block. If it is detected by an erase verify operation that there is an unqualified erase operation, an erase pulse Vers1 that is one step voltage higher than the initial erase pulse Vers0 is applied. The voltage of the erase pulse is incremented sequentially until erase operations of all memory cells in the block are all qualified.

Similarly, when programming, it is hard to make floating gates of all memory cells in a page all accumulate electrons evenly. In some memory cells, electrons are easy to be poured into floating gates, while in some other memory cells, electrons are not easy to be poured into floating gates. Therefore, if the same programming voltage is applied to the two kinds of memory cells, threshold value shift amounts of the two kinds of memory cells will be quite different. For example, in some memory cells, electrons are sufficiently accumulated in floating gates and thus threshold values can be within the threshold value distribution width of "0", while in some other memory cells, electrons are insufficiently accumulated in floating gates and thus some threshold values may not be within the threshold value distribution width of "0". In view of this, if it is detected by a program verify operation that there is a memory cell in which electrons are insufficiently poured into the floating gate of the memory cell, the programming voltage has to be applied to the memory cell again to make the threshold value of the memory cell be within the threshold value distribution width of "0".

In order to correctly and effectively pour electrons into memory cells, an ISPP (Incremental Step Pulse Program) method is usually used. As shown in FIG. 1B, in the ISPP method, an initial programming pulse Vpgm0 is applied to a selected page. If it is detected by a program verify operation that there is an unqualified programming operation, a programming pulse Vpgm1 that is one step voltage higher than the initial programming pulse Vpgm0 is applied. The voltage of the programming pulse is incremented sequentially until programming operations of all memory cells in the page are all qualified.

Moreover, due to the high integration of the flash memory, sizes of memory cells become smaller, and resistances of word lines and bit lines become larger because of fine sizes of the word lines and the bit lines. Thus, voltage drops on the word lines and the bit lines become larger. Accordingly, a problem that charging time of the word lines and the bit lines increase may occur. In Patent Document 1, in order to reduce data write-in time, preliminary data whose temporary level is lower than the level of the threshold voltage is written-in, and a write-in verify operation is performed on read-out data. The waiting time of word lines at this time is smaller than the waiting time when reading-out final data in a write-in verify operation.

RELATED PATENT DOCUMENTS

[Patent Document 1] JP 2010-302960

BRIEF SUMMARY OF THE INVENTION

Problems to be Solved

The flash memory requires certain endurance (the number of times of data rewrites) and a certain data holding characteristic. When F-N tunneling current flows through the oxide film, some electrons are trapped by the oxide film and accumulated in the oxide film. In this case, though a voltage is applied to the control gate, the F-N tunneling current is difficult to flow through the oxide film, thereby restraining the number of times of data rewrites. Furthermore, charges accumulated in the floating gate may leak out from the floating gate as time goes by, and therefore the stored data may be lost. In view of this, an insulation layer surrounding the floating gate for preventing characteristic deterioration is required.

In the flash memory, since sizes of the memory cells become smaller, it is known that deterioration of the endurance and the data holding characteristic becomes more obvious. FIG. 2 is a block diagram of program/erase cycle characteristics. In FIG. 2, the longitudinal axis represents a threshold value Vt of a memory cell, and the lateral axis represents the number of program/erase cycles (source: The new program/Erase Cycling Degradation Mechanism of NAND Flash Memory Devices, Albert Fayrushin, et al. Flash Core Technology Lab, Samsung Electronics Co, Ltd, IEDM09-823, P34.2.1-2.4). As shown in FIG. 2, the threshold value Vt of the programmed/erased memory cell doesn't change obviously before the number of program/erase cycles approaches 10-20K. However, after the number of program/erase cycles exceeds a number of thousands of cycles, the threshold value Vt is shifted toward a positive value. That is, as the number of program/erase cycles increases, electrons are trapped by the gate oxide film, which is presumed to be one of the reasons for deterioration of the gate oxide film caused by electron tunneling.

When erasing the flash memory, in order to meet the needs under the same erase condition even after cycles, the pulse duration has to be increased to successfully erase data by one pulse. In addition, since the threshold value Vt increases after the number of program/erase cycles exceeds 1K cycles, the erase voltage has to be increased to maintain the erase time. On the other hand, if the number of times of pulses is increased, the erase time will be increased. When programming, though it is preferred to decrease the number of pulses so as to accelerate the programming speed as cycles proceed, the voltage level of the initial programming pulse is not changed.

Nevertheless, as the number of program/erase cycles increases, the number of times of pulses increases and a high voltage is applied, thereby causing a problem that the deterioration of the gate oxide film and the insulation layer surrounding the floating gate speeds up.

The purpose of the invention is to provide a non-volatile semiconductor memory that is capable of restraining rapid deterioration of memory cells so as to solve the problems described above. In addition, the purpose of the invention is further to provide a non-volatile semiconductor memory in which appropriate programming voltage and erase voltage are provided according to abrasion levels of memory cells.

Means for Solving the Problems

An embodiment of the invention provides a non-volatile semiconductor memory device, comprising: a memory array, comprising a plurality of memory cells arranged in a matrix form. In a programming operation, the non-volatile semiconductor memory applies one or more than one programming pulse on a selected page of the memory array to program data to the selected page. In an erase operation, the non-volatile semiconductor memory applies one or more than one erase pulse on a selected block of the memory array to erase data in the selected block. Before the erase operation, the non-volatile semiconductor memory performs a pre-program operation. After the erase operation, the non-volatile semiconductor memory performs a post-erase operation. In the post-erase operation, the non-volatile semiconductor memory writes in voltage information relating to programming pulses of each page of the selected block and voltage information relating to erase pulses of the selected block to a predefined region in the selected block. In the pre-program operation, the non-volatile semiconductor memory programs each page of the selected block according to voltage information relating to programming pulses which is stored in the predefined region. In the erase operation, the non-volatile semiconductor memory erases data in the selected block according to voltage information relating to erase pulses which is stored in the predefined region.

In the post-erase operation, the non-volatile semiconductor memory further updates the voltage information relating to programming pulses based on a verify result of programming each page of the selected block according to the voltage information relating to programming pulses and writes in the updated voltage information relating to programming pulses. When a threshold value of any memory cell in the selected page is larger than a reference value, the non-volatile semiconductor memory updates the voltage information relating to programming pulses to decrease an initial value of programming pulses. The voltage information relating to programming pulses comprises n bits of non-converted codes which are binary data indicating an initial value of programming pulses of each word line and n bits of converted codes which are converted from the non-converted codes. When the non-converted codes and the converted codes are written-in to the predefined region, the non-volatile semiconductor memory verifies memory cells designated by binary data of the non-converted codes and the converted codes. The non-volatile semiconductor memory updates the voltage information relating to erase pulses based on an amount of erase pulses in the erase operation and writes in the updated voltage information relating to erase pulses. The non-volatile semiconductor memory determines whether the amount of erase pulses in the erase operation is larger than a predefined number, and when the amount of erase pulses in the erase operation is larger than the predefined number, the non-volatile semiconductor memory updates the voltage information relating to erase pulses to increase an initial value of erase pulses. The non-volatile semiconductor memory obtains a minimum value of initial values of programming pulses of all pages in the selected block from the voltage information relating to programming pulses and uses a programming pulse which is equal to the minimum value incremented by a predefined voltage to program the selected block. The non-volatile semiconductor memory reads out the voltage information relating to programming pulses and the voltage information relating to erase pulses stored in the predefined region and stores the read-out voltage information to a register at least during the erase operation.

Another embodiment of the invention provides a non-volatile semiconductor memory, comprising: a memory array, comprising a plurality of memory cells arranged in a matrix form, wherein the non-volatile semiconductor memory applies one or more than one programming pulse to a selected page of the memory array in a programming operation to program data to the selected page and applies one or more than one erase pulse to a selected block to erase data in the selected block; and a storage unit, comprising a predefined region, wherein the predefined region is used to store voltage information relating to programming pulses of all pages in the selected block in the erase operation, wherein the non-volatile semiconductor memory reads out voltage information relating to programming pulses of the selected page from the predefined region, applies a first programming pulse according to the voltage information relating to programming pulses of the selected page, and then determines a voltage of a second programming pulse according to a verify result.

When a threshold value of any memory cell in the selected page is larger than a reference value, the voltage of the second programming pulse is V1, and when threshold values of all memory cells in the selected page are not larger than the reference value, the voltage of the second programming pulse is V2, wherein V1 is smaller than V2.

Another embodiment of the invention provides an erasing method, applied to a non-volatile semiconductor memory, wherein the non-volatile semiconductor memory comprises a memory array consisting of a plurality of memory cells arranged in a matrix form, wherein the erasing method comprises: selecting a block according to an erase command and address information; reading out, from a predefined region in the block, voltage information relating to programming pulses which are used when programming each page in the block; performing a pre-program operation on each page in the block according to the voltage information relating to programming pulses; erasing the block according to voltage information relating to erase pulses; updating the voltage information relating to programming pulses and the voltage information relating to erase pulses according to predefined criteria; and writing-in the updated voltage information relating to programming pulses and the updated voltage information relating to erase pulses to the predefined region and performing a post-erase operation.

Updating the voltage information relating to programming pulses and the voltage information relating to erase pulses according to predefined criteria further comprises: determining whether an amount of erase pulses used in erasing is larger than a predefined number, and when the amount of erase pulses is larger than the predefined number, updating the voltage information relating to erase pulses to increase an initial value of erase pulses. Updating the voltage information relating to programming pulses and the voltage information relating to erase pulses according to predefined criteria further comprises: in a verification after performing a programming operation by using an initial value of programming pulses obtained from the voltage information relating to programming pulses, determining whether there is any memory cell whose threshold value is larger than a reference value in the selected page; and when there is a memory cell whose threshold value is larger than a reference value in the selected page, updating the voltage information relating to programming pulses to decrease an initial value of programming pulses. The voltage information relating to programming pulses comprises n bits of non-converted codes which are binary data indicating an initial value of programming pulses of each word line and n bits of converted codes which are converted from the non-converted codes, and the post-erase operation comprises: when writing-in the non-converted codes and the converted codes to the predefined region, verifying memory cells designated by binary data of the non-converted codes and the converted codes. The pre-program operation comprises: obtaining a minimum value of initial values of programming pulses of all pages in the selected block from the voltage information relating to programming pulses, and using a programming pulse which is equal to the minimum value incremented by a predefined voltage to program the selected block.

Another embodiment of the invention provides a programming method, applied to a non-volatile semiconductor memory, wherein the non-volatile semiconductor memory comprises a memory array consisting of a plurality of memory cells arranged in a matrix form, wherein the programming method comprises: when erasing data in a block, storing information relating to programming pulses which are used when programming each page in the block to a predefined region; selecting a page according to a programming command and address information; reading out the information form the predefined region; applying a first programming pulse to the page according to the information; verifying the page by using a predefined voltage; and determining a voltage of a second programming pulse according to a result of verifying the page by using the predefined voltage.

When a threshold value of any memory cell in the selected page is larger than a reference value, the voltage of the second programming pulse is V1, and when threshold values of all memory cells in the selected page are not larger than the reference value, the voltage of the second programming pulse is V2, wherein V1 is smaller than V2.

Effect of the Invention

As described above, in the invention, appropriate programming voltage and erase voltage are provided according to the program/erase cycle characteristics. Accordingly, a long-lived flash memory that is able to prevent partial deterioration of the number of times of data rewrites and the data holding characteristic is provided.

BRIEF DESCRIPTION OF THE DRAWINGS

The invention can be more fully understood by reading the subsequent detailed description and examples with references made to the accompanying drawings, wherein:

FIG. 7 is a block diagram of trimming codes stored in a spare region of a memory block;

FIG. 11 is a block diagram of updated trimming codes which are updated in the post-erase in FIG. 5;

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

The embodiments of the invention are described below with references made to the accompanying drawings. Here, a NAND-type flash memory is used as an example for illustrating the general principles of the invention in a preferred embodiment. In addition, to be noted, for simplicity and clarity, the elements in the Figures may be enlarged and have different proportions from that in the practical situation.

Figure 3:
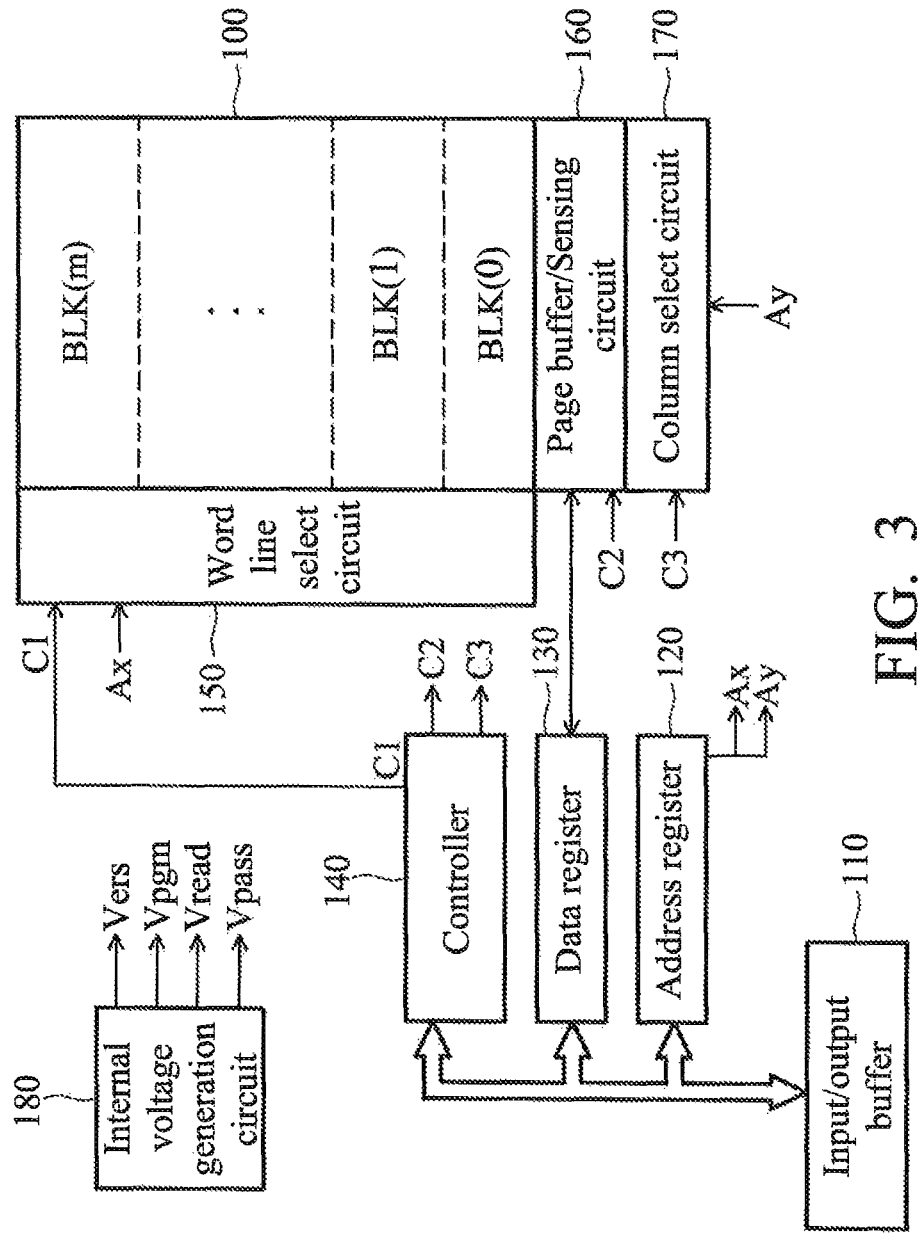
FIG. 3 is a block diagram of a configuration of a flash memory according to an embodiment of the invention.

FIG. 3 is a block diagram of a configuration of a flash memory according to an embodiment of the invention. The flash memory shown in FIG. 3 is used as an example for illustrating the general principles of the invention and should not be taken in a limiting sense.

The flash memory 10 in the embodiment comprises: a memory array 100, including a plurality of memory cells arranged in a matrix form; an input/output buffer 110, connected to an external input/output terminal I/O; an address register 120, receiving address information from the input/output buffer 110; a data register 130, storing input/output data; a controller 140, providing, according to command information received from the input/output buffer 110 and external control signals, control signals C1, C2, C3 and so on which control components of the memory; a word line select circuit 150, decoding a row address Ax received from the address register 120 and selecting a memory block, a word line, and so on based on the decoding result; a page buffer/sensing circuit 160, storing data read out from a page selected by the word line select circuit 150 and storing data to be written-in to the page; a column select circuit 170, decoding a column address Ay received form the address register 120 and selecting column data in a page buffer according to the decoding result; and an internal voltage generation circuit 180, generating voltages (for example, a programming voltage Vpgm of ISPP, a pulse voltage Vpass, a read-out voltage Vread and an erase voltage Vers of ISPE) used in reading-out, programming, erasing, verifying, and so on.

Figure 4:
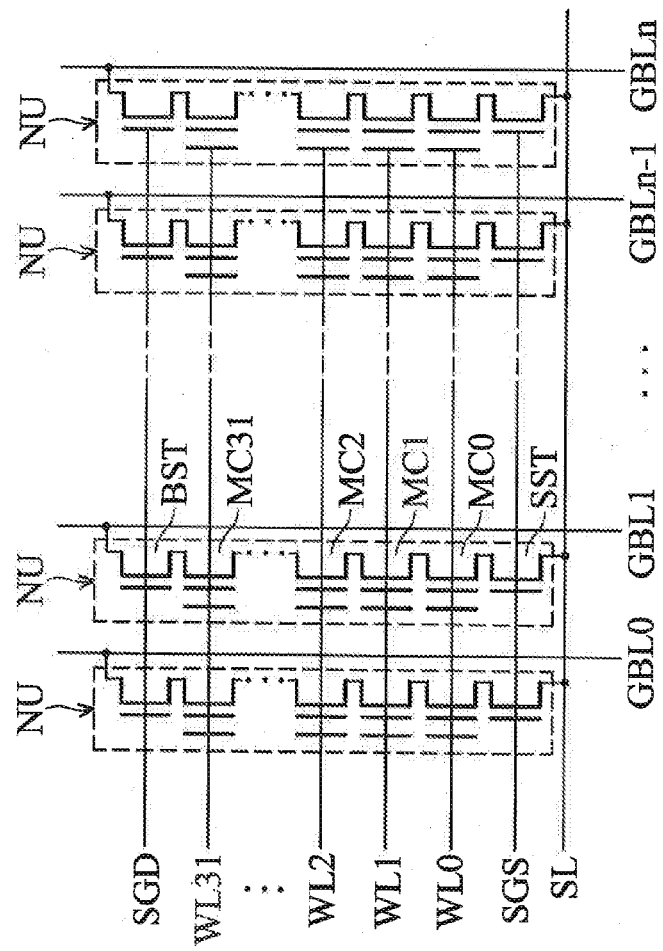
FIG. 4 is a block diagram of a configuration of cell units in a memory block.

The memory array 100 comprises blocks BLK(0), BLK(1) . . . BLK(m). FIG. 4 is a circuit diagram of a configuration of NAND strings in a memory block. One memory block comprises a plurality of NAND strings. Each NAND string (called a cell unit NU in the following) is constructed by a plurality of memory cells connected in serial. The plurality of cell units NU is arranged along the row direction.

Each cell unit NU comprises 32 memory cells MCi (i=0, 1 . . . , 31) connected in serial, a select transistor BST connected to the drain side of the memory cell MC31, and a select transistor SST connected to the source side of the memory cell MC0. The drain of each select transistor BST is connected to one corresponding bit line GBL, and sources of select transistors SST are connected to a common source line SL. The control gate of the memory cell MCi is connected to a corresponding word line WLi. Gates of select transistors BST are connected to a select gate line SGD parallel to word lines WLi and gates of select transistors SST are connected to a select gate line SGS parallel to word lines WLi. When the word line select circuit 150 selects a memory block according to the row address AX, select transistors BST and SST are selectively driven through select gate lines SGD and SGS of the memory block.

Figure 1B:
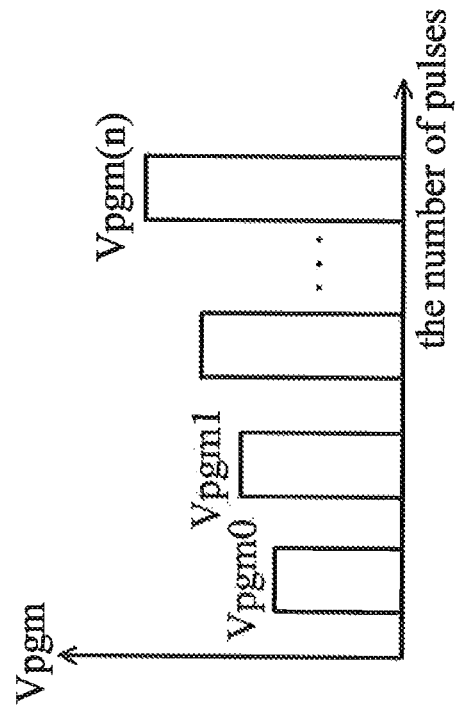
FIG. 1B is a block diagram of an ISPP method.
Figure 1A:
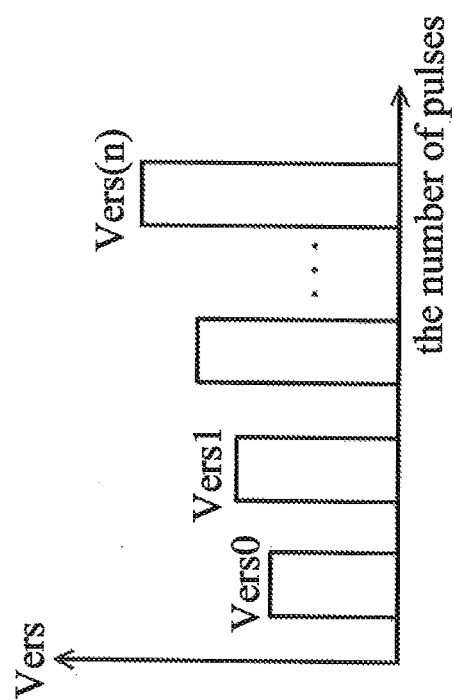
FIG. 1A is a block diagram of an ISPE method.
Figure 2:
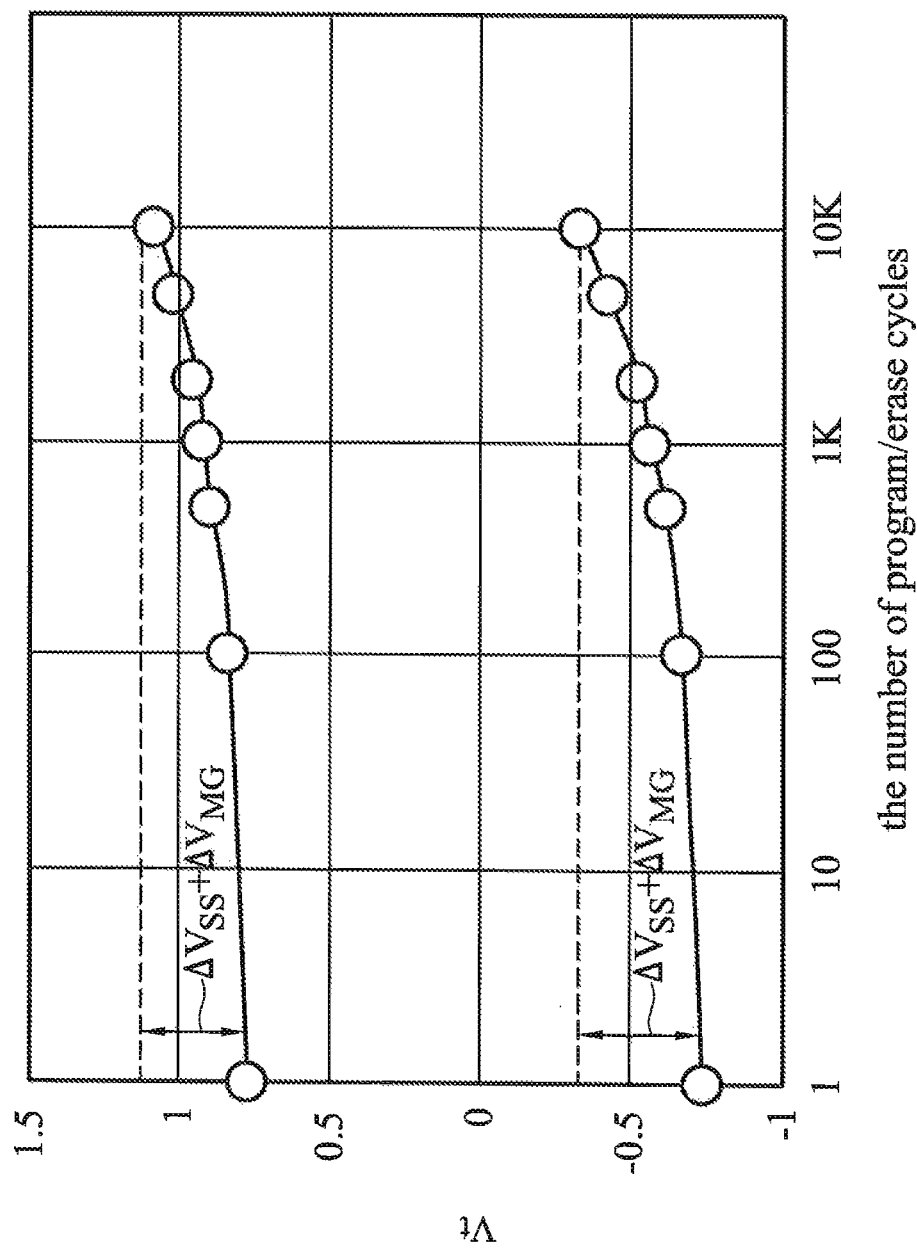
FIG. 2 is a block diagram illustrating a relationship between the number of times of data rewrites and a threshold value of a memory cell.

As shown in FIG. 2, when the number of program/erase cycles increases, the threshold voltage Vt of the programmed/erased memory cell is shifted toward a positive value due to causes such as deterioration of the tunnel oxide film and trapping of electrons by the tunnel oxide film. That is, voltages required in programming and erase operations have to be increased.

When programming and erasing, the threshold value of the memory cell is controlled to be within distribution widths of "0" and "1", and the programming operation and the erase operation are verified according to the distribution widths or margins. For example, in a case where the distribution widths of "0" and "1" are narrow, a verify voltage has to be shifted toward a positive value as the threshold voltage is shifted toward a positive value, and the programming voltage and the erase voltage are increased accordingly. On the other hand, in a case where the distribution widths of "0" and "1" are wide, the verify voltage doesn't have to be increased, and high programming and erase voltages are restrained, thereby preventing rapid deterioration of the memory cell.

Regarding a flash memory having a purpose to store massive data, such as copying data recorded in a DVD and preserving data captured by a digital camera, the number of times of massive data rewrites is less in the flash memory of this kind, and thus good endurance is not severely necessary, but on the other hand, a good data holding characteristic is required. On the contrary, regarding a flash memory used for power monitoring and security, good endurance is required. In the embodiment, programming voltages and erase voltages that are appropriate for memory cells are provided, and thus the rapid deterioration of the flash memory is restrained. Moreover, in the embodiment, a flash memory having endurance and a data holding characteristic that correspond to the usage of the flash memory is provided.

Figure 5:
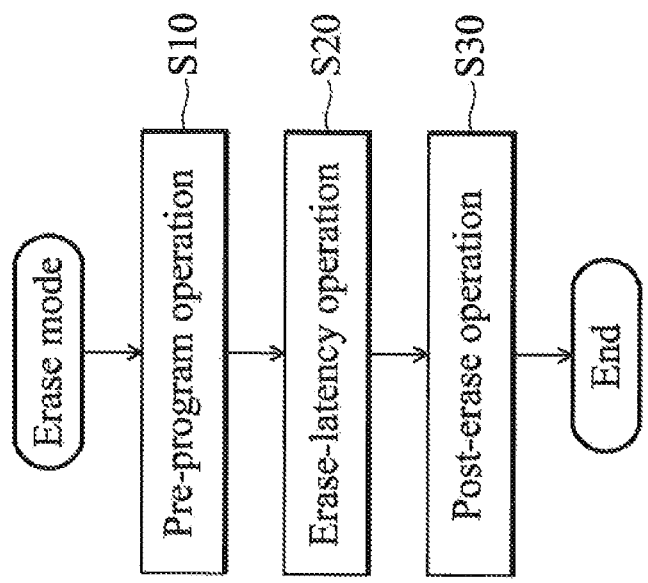
FIG. 5 is a flowchart of an operation in an erase mode according to an embodiment of the invention.

FIG. 5 is a flowchart of an erase mode of a flash memory according to an embodiment of the invention. As shown in FIG. 5, the erase mode in the embodiment comprises three steps: a pre-program operation (step S10), an erase-latency operation (step S20) and a post-erase operation (step S30).

Figure 6:
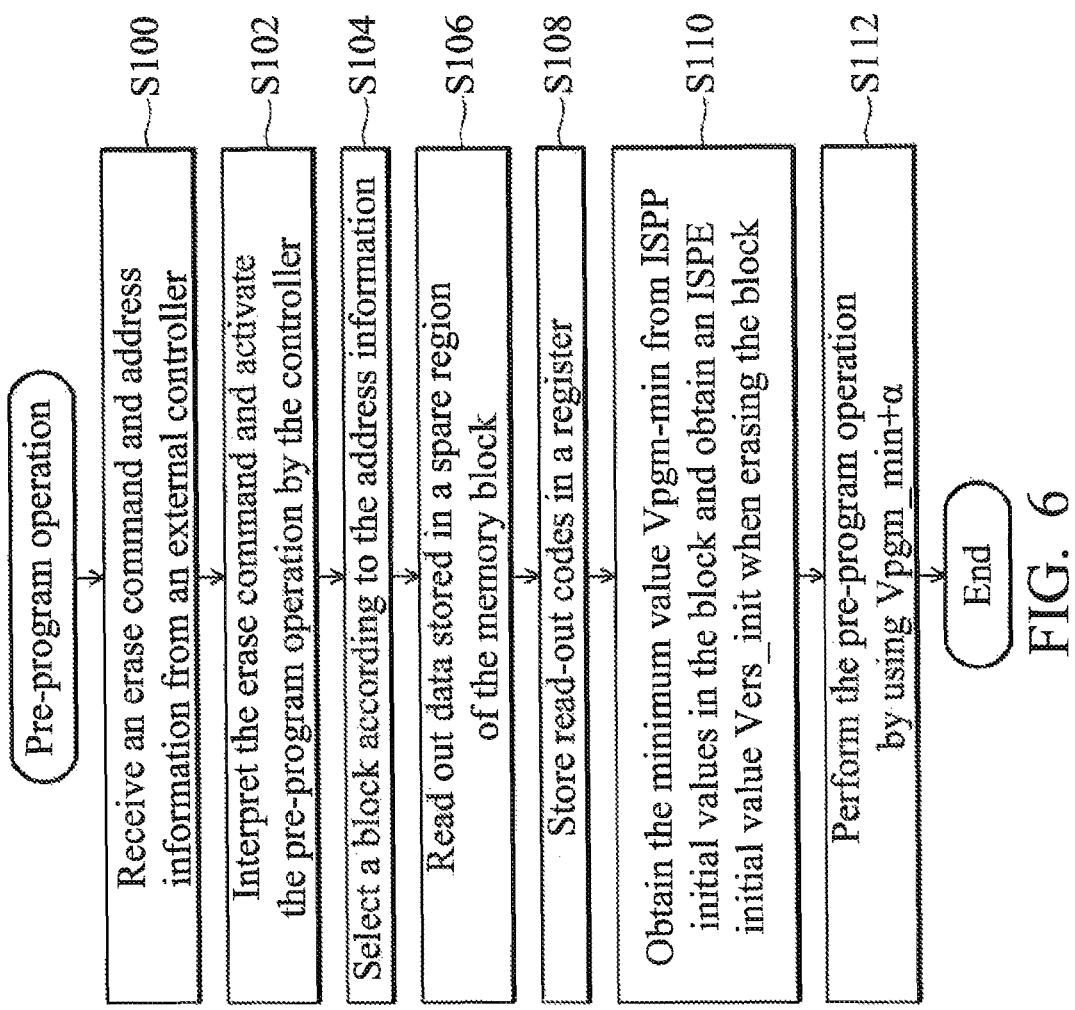
FIG. 6 is a flowchart of a detail operation of the pre-program operation in FIG. 5.

FIG. 6 is a flowchart of a detailed operation of the pre-program operation (step S10) in FIG. 5. Firstly, the flash memory 10 receives an erase command and address information regarding memory positions to be erased (for example, high-order bits of a column address) from an external controller (step S100). The controller 140 of the flash memory 10 interprets the erase command and activates the procedure of the pre-program operation (step S102). The controller 140 controls the word line select circuit 150 to select a memory block in the memory array 100 according to the address information provided by the address register 120 (step S104). Then, the controller 140 reads out data stored in a spare region of the selected memory block (step S106). The read-out data comprises the minimum value Vpgm_init of programming pulse voltages used when performing a programming operation on each word line of the memory block by an ISPP method and an initial value Vers_init of erase pulse voltages used when erasing the memory block by an ISPE method.

FIG. 7 is a block diagram illustrating an example in which the data stored in the spare region of the memory block is trimming codes. The trimming codes, comprising 8 bits of non-inverted codes including 00~08 and 8 bits of inverted codes including 10~17, are binary data and indicate an initial value of programming pulses used when data of each page in the memory block is programmed. Here, as an example, the relationship between programming voltages 16.4V~17.8V and word lines 31~25 is shown. The minimum voltage among voltages corresponding to data "0" is the initial value Vpgm_init of the ISPP method. For example, the initial value Vpgm_init of programming voltages of the word line 25 is 16.8 V, initial values Vpgm_init of word lines 26, 27, 29 and 31 are 17V, the initial value Vpgm_init of the word line 30 is 17.2V, and the initial value Vpgm_init of the word line 28 is 17.4V. In the row "Verify", "0" indicates qualified while "1" indicates unqualified.

The trimming codes are written-in to the spare region in the post erase operation (step S30) and the post erase operation will be described later. When the trimming codes are written-in to the spare region, data "0" is an indicator used to check programming statuses of memory cells. That is, a verify operation where verify voltage=0V is performed on each page and whether data "0" appears is monitored at the same time.

In a case where only the non-inverted codes are used, the number of bits of "0" included in each page may be different. For example, the number of "0" of the word line 31 is 5 bits, and the number of "0" of the word line 28 is 3 bits. A programming status of each page which actually may comprise thousands or tens of thousands of bits can be estimated by using the number of bits of "0" of each page, wherein the number of bits of "0" of each page is different from page to page. In view of this, the precision of the estimation of the programming status of each page will be higher if more bits are consulted. Moreover, in the estimation of the programming status of each page, it is preferred that there is no determination variation among word lines. In the embodiment, the inverted codes are used to make each word line have 8 bits of "0", and thus the consulted bits for checking the programming status of each word line are increased, thereby raising the precision of the estimation. In addition, since the total number of "0" of each word line is the same, the determination variation among word lines can be restrained. Furthermore, in the trimming codes, the initial value Vers_init of the ISPE method performed when erasing the memory block is stored corresponding to either word line.

Referring back to FIG. 6, the controller reads out the trimming codes from the spare region and stores the read-out trimming codes in a register (step S108). In a case where only the non-inverted codes are stored in the spare region, the controller 140 can generate the inverted codes from the non-inverted codes and then store the inverted codes together with the non-inverted codes in the register. Moreover, the register can be an internal memory consisting of SRAM or DRAM, or a predefined memory region allocated from a portion of the memory array 100.

The controller 140 performs a NAND calculation on the trimming codes shown in FIG. 7 to obtain the minimum value Vpgm_min of initial values of programming voltages in the memory block (step S110). In the example as shown in FIG. 7, the minimum value Vpgm_min of the memory block is 16.8V. Moreover, the controller 140 reads out, from the trimming codes, the initial value Vers_init of the ISPE method performed when erasing the memory block.

Next, the controller 140 applies a pulse having a voltage value that is equal to the minimum value Vpgm_min of initial values of the ISPP method incremented by α (i.e., Vpgm_min+α) to all word lines of the memory block which is selected to be an erase target and performs a pre-program operation on the whole memory block (including the spare region thereof) (step S112). Here, α is a predefined value and is set to an expected value that makes data "0" be written-in to all memory cells of the memory block. For example, α can be a voltage which is equal to three step voltages, the maximum value Vpgm_max of initial values of the ISPP method in the trimming code (Vpgm_min+α=Vpgm_max, in the example shown in FIG. 7, Vpgm_max is 17.4V), or an intermediate value between the minimum value Vpgm_min and the maximum value Vpgm_max.

Figure 8:
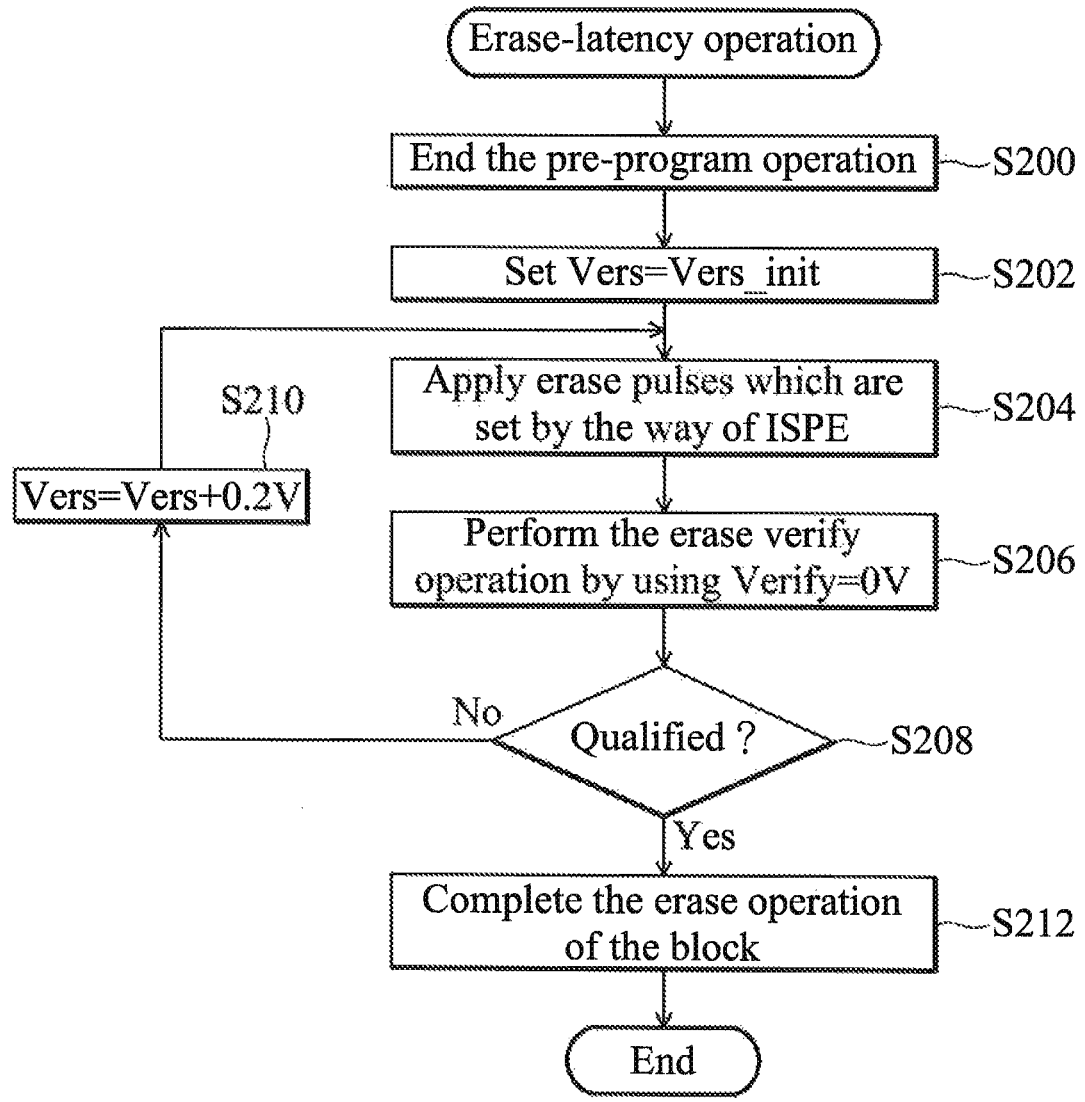
FIG. 8 is a flowchart of a detail operation of the erase-latency operation in FIG. 5.

Then, when the pre-program operation ends, the controller 140 shifts to performing the erase-latency operation. FIG. 8 is a flowchart of a detail operation of the erase-latency operation. When the pre-program operation ends (step S200), the controller 140 reads out the initial value Vers_init of erase voltages from the register and sets the initial value Vers_init to an initial value of erase pulses (step S202). Next, by the control of the controller 140, 0V is applied to all word lines of the selected memory block and the erase voltage Vers_init is applied to the well region of the substrate so as to erase data in the memory block (step S204).

After that, an erase verify operation is performed by using a verify voltage Verify=0V (step S206). That is, 0V is applied to all word lines of the erased memory block and then whether each word line is on is verified. If it is checked that the threshold value Vt is smaller than 0 for all pages, it is determined that the erase operation is qualified (step S208: Yes), and then the erase operation of the memory block is completed (step S212). If any page is erased incompletely (step S208: No), the erase voltage Vers is incremented by one step voltage of 0.2V, that is, the erase voltage Vers is set to Vers+0.2V (step S210), and the erase pulse is applied again. If there is still any incompletely erased page, the same steps are repeated until all pages are erased completely. A counter can be used to count the required number of erase pulses used when erasing, and the counted value is stored. Since the erase verify operation is performed by using the verify voltage Verify=0V, application of high voltages is moderated and deterioration of memory cells is restrained.

Figure 9:
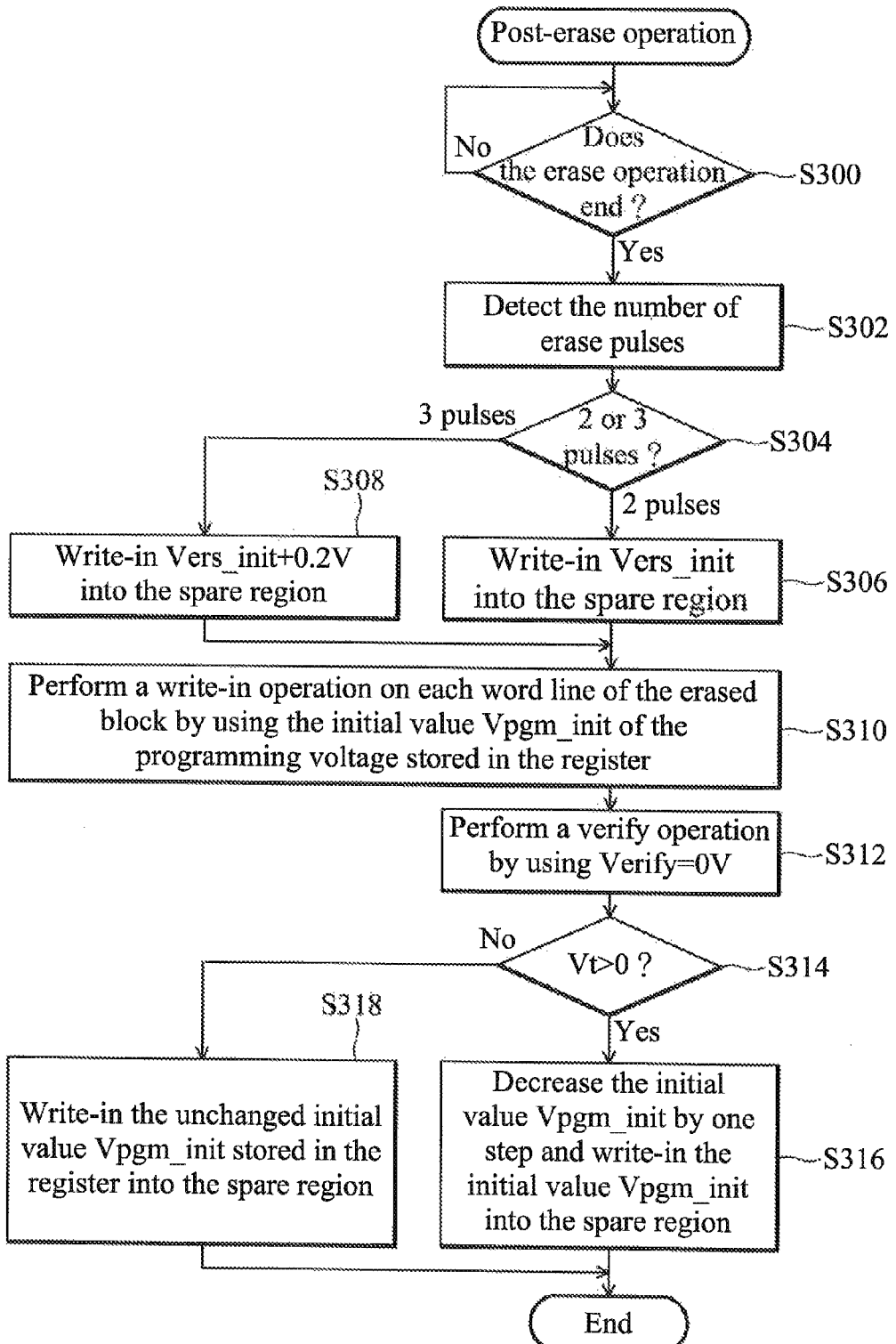
FIG. 9 is a flowchart of a detail operation of the post-erase operation in FIG. 5.

After the erase-latency operation ends, the controller 140 performs the procedure of the post-erase operation. FIG. 9 is a flowchart of a detail operation of the post-erase operation (step S30). After the erase operation of the selected memory block ends (step S300: Yes), the controller 140 checks the required number of erase pulses used when erasing (step S302). As described above, the number of erase pulses is the counted value stored in the counter during the erase-latency operation. The controller 140 determines whether the number of erase pulses is 2 or 3 (step S304). If the number of erase pulses is 2, the initial value Vers_init of erase voltages which is stored in the register is directly (unchangeably) written-in to the spare region of the selected memory block. On the other hand, if the number of erase pulses is 3, the initial value Vers_init of erase voltages is incremented by one step voltage (e.g., 0.2V), and then the updated initial value Vers_init is written-in to the spare region (step S308).

Figure 10:
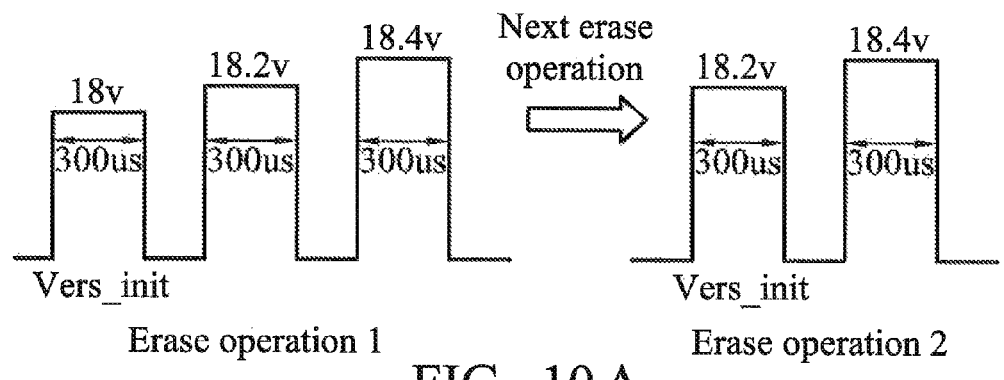
FIG. 10A is a block diagram illustrating an example of erase pulses in an ISPE method according to an embodiment of the invention.
FIG. 10B is a block diagram illustrating an example of programming pulses in an ISPP method according to an embodiment of the invention.
Figure 10:
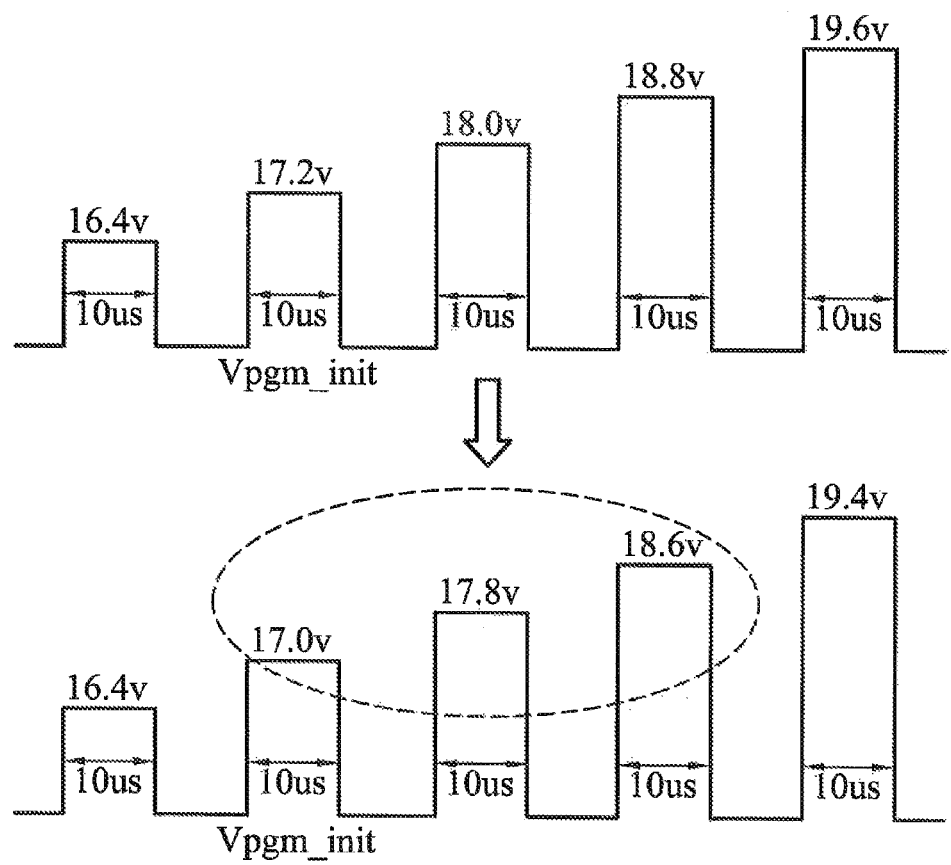

FIG. 10A is a block diagram illustrating an example of the updated initial value Vers_init when the number of erase pulses is 3. As shown in FIG. 10A, in an erase operation 1, when the third erase pulse of 18.4 V is applied, the erase operation is determined to be qualified in the verify operation based on the procedure of the erase-latency operation. Therefore, in a post-erase mode, the initial value Vers_init of erase voltages in the spare region is updated to be 18.2V and then the updated initial value Vers_init is stored. After that, when an erase operation 2 is performed on the same memory block, the initial value Vers_init of erase pulses becomes 18.2V, and an erase pulse having 18.4 V is then applied. Applying time of one erase pulse is about 300 μs, and thus the total applying time is about 900 μs in the erase operation 1. In the erase operation 2, the initial value is raised to 18.2V, and in another aspect, the total applying time may be reduced to about 600 μs, thereby easing the deterioration of the memory. Moreover, though 2 or 3 pulses are illustrated in the embodiment, the invention is not limited thereto. For example, regarding erase pulses other than 2 and 3 pulses, whether the amount of the erase pulses is larger than a certain number can be determined in the similar way as described in the embodiment, and then the initial value Vers_init can be changed according to the determination result.

Referring to FIG. 9 again, the controller 140 applies the initial value Vpgm_init of each word line stored in the register to each word line of the erased memory block and performs a programming operation on the trimming codes in the spare region of the memory block (step S310). At this time, since the trimming codes comprise non-inverted codes and inverted codes, for each word line, the programming status of 8 bits of "0" is monitored in a verify operation. After the programming operation is performed by using the initial value Vpgm_init of programming pulses of each word line, 0V is applied to each word line to check whether the word line is on. That is, the verify operation is performed by using the verify voltage Verify=0V. If there is any memory cell whose threshold value Vt is larger than 0V in a programmed page, that is, if any bit of the 8 bits indicates qualified, the controller 140 updates the codes stored in the register so as to decrease the initial value Vpgm_init of programming voltages of the page by one step voltage and writes in the updated codes to the spare region (step S316). It is considered that the programming speed of memory cells in which tunnel oxide films are deteriorated by erasing the block becomes higher, and therefore the initial value is decreased to restrain this kind of phenomenon.

On the other hand, if threshold values Vt of all memory cell in a programmed page are smaller than or equal to 0V, that is, if the verify result indicates that all the 8 bits are unqualified, the controller 140 writes in the codes stored in the register to the spare region unchangeably (step S318), considering that data holding characteristics of memory cells usually recover. In addition, though it is not shown in FIG. 9, the procedure of programming the trimming codes into the spare region is performed after the steps in FIG. 9. In other words, the process of applying programming pulses sequentially based on the ISPP method and storing the trimming codes to the spare region is continuously performed until it is verified by using the predefined verify voltage that the programming operation is qualified. At this time, the trimming codes comprise updated non-converted codes and converted codes converted from the updated non-converted codes.

FIG. 11 is a block diagram of the updated trimming codes. In a case where the initial value Vpgm_init of programming voltages is used to perform an programming operation on the word line 28, if Vt is larger than 0 in the very operation of the word line 28, the initial value Vpgm_init is decreased by one step voltage, as shown in step S316, and the data of 17.2V of the word line 28 is updated from "1" to "0". That is, the initial value Vpgm_init of the word line is updated to 17.0V.

FIG. 10B is a block diagram illustrating an example of programming pulses based on the ISPP method. It is assumed that the initial value Vpgm_init=17.2V is applied to the word line 28 in the post erase operation. If Vt is larger than 0 in the very operation, the initial value Vpgm_init is decreased by one step voltage, and thus the initial value Vpgm_init becomes 17.0V now. The initial value Vpgm_init is read out during the programming operation in the programming mode, and the programming operation of the page is performed starting from applying a programming pulse having the initial value Vpgm_init that is 17.0V.

Figure 12:
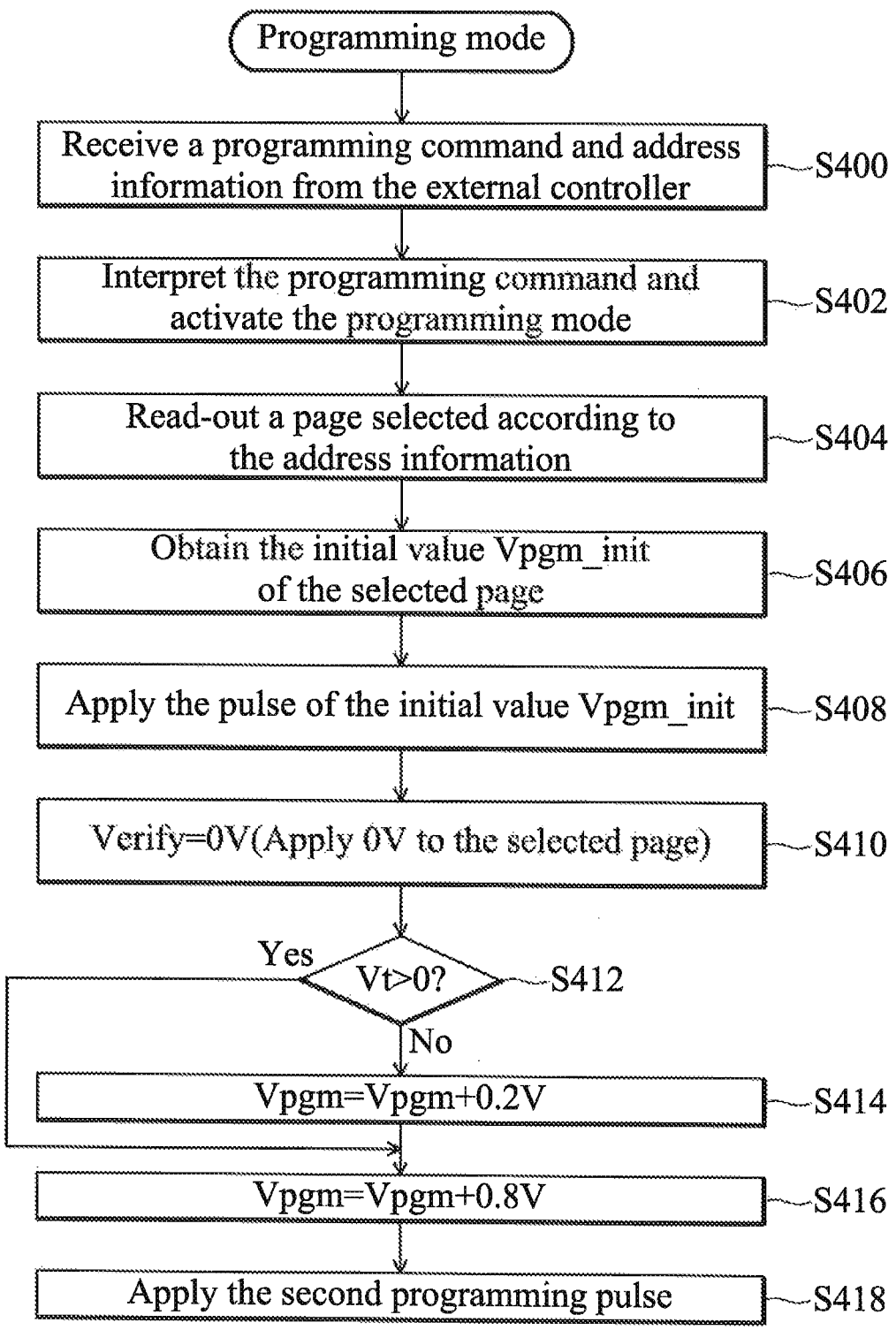
FIG. 12 is a flowchart of an operation in a programming mode according to an embodiment of the invention.

The programming mode in the embodiment will be described in the following. FIG. 12 is a flowchart of a detail operation of the programming mode. In the programming mode, an initial value Vpgm_init of programming voltages stored in a spare region of a memory block is read out, and the read-out initial value Vpgm_init is used to perform a write-in operation based on the ISPP method.

The controller 140 receives a programming command and address information from the external controller (step S400), then interprets the programming command and actives the programming mode (step S402). The controller 140 selects a memory block and a page according to the address information (step S404) and then obtains the initial value Vpgm_init (the minimum voltage among voltages corresponding to data "0") of programming voltages stored in the spare region of the selected page (step S406). Next, the controller 140 applies the initial value Vpgm_init to the selected page and performs data write-in on the selected page (step S408). Then, the controller 140 sets a verify voltage Verify to 0V. That is, the controller 140 applies 0V to the selected page to perform a verify operation on the selected page (step S410) and determines whether there is any memory cell whose threshold value Vt is larger than 0 in the selected page (step S412).

If there is any memory cell whose threshold value Vt is larger than 0 in the selected page, the programming speed is determined to be fast, and Vpgm=Vpgm+0.8V (step S416). Therefore, it is controlled that the step voltage is set to 0.8V in the ISPP method, and the programming operation proceeds based on the ISPP method in which the step voltage is 0.8V. On the other hand, if there is no memory cell whose threshold value Vt is larger than 0 in the selected page, that is, if there is no data "0", it is considered that data holding characteristics of memory cells can be improved under the time course starting from the end of the erase operation. Therefore, a step voltage of next programming voltage is increased to 1V after steps of Vpgm=Vpgm+0.2V (step S414) and Vpgm=Vpgm+ 0.8V (step S416), and the ISPP method after the second programming pulse is performed based on the step voltage. In addition, though it is not shown in FIG. 12, a program verify operation is performed on the selected page by using a predefined voltage higher than 0V after the steps in FIG. 12. When the programming operation is determined to be qualified in the program verify operation, the programming operation on the selected page ends.

Figure 13:
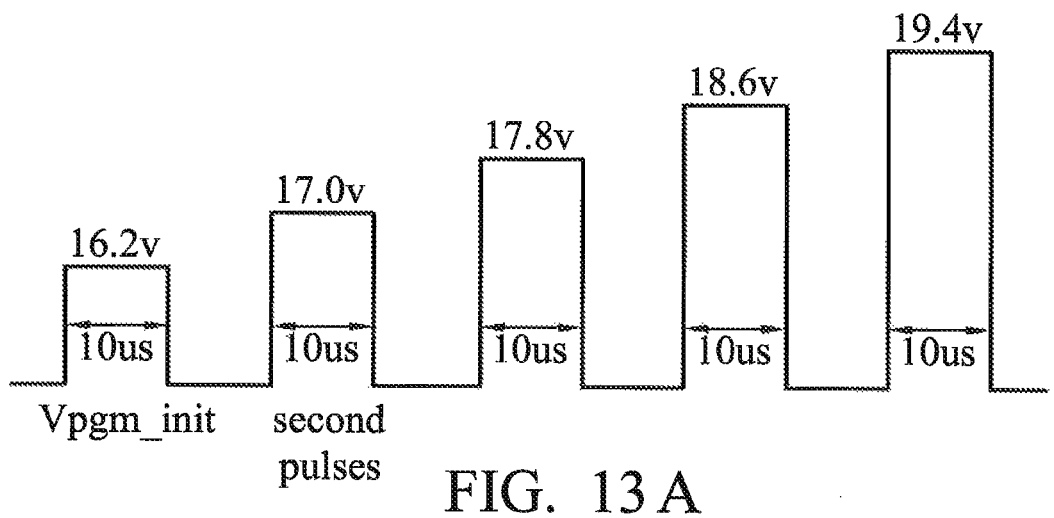
FIG. 13A is a block diagram of normal ISPP pulse voltages in a programming mode according to an embodiment of the invention.
FIG. 13B is a block diagram of ISPP pulse voltages in a programming mode when a programming speed is decelerated according to an embodiment of the invention.
Figure 13:
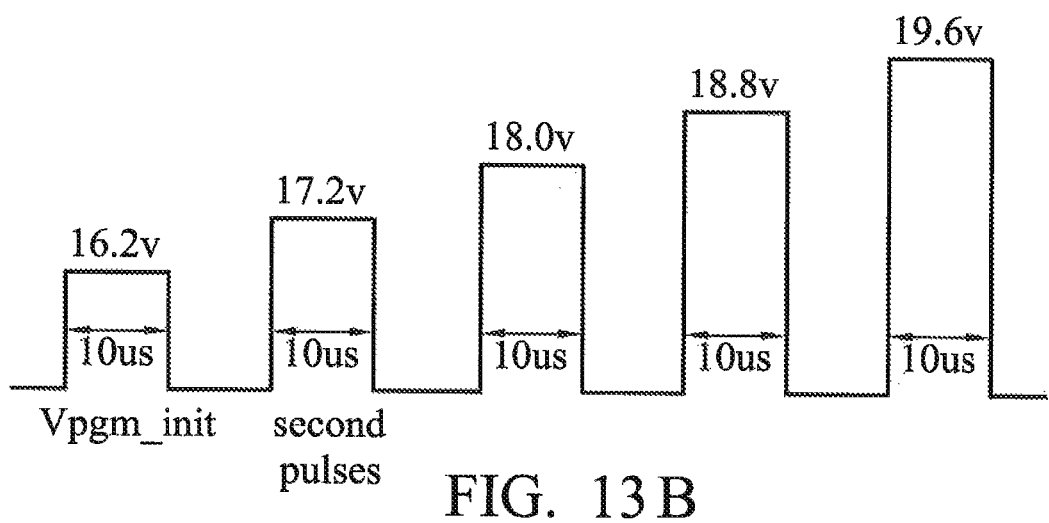

FIG. 13 illustrates block diagrams of ISPP pulse waveform. FIG. 13A is a block diagram of normal ISPP pulse voltages, wherein the initial value Vpgm_init is 16.2V and the pulse voltage is incremented by a step voltage of 0.8V. FIG. 13B is a block diagram of ISPP pulse voltages when the programming speed is decelerated as described above, wherein the step voltage is increased to 1V and the second pulse voltage becomes 17.2V.

Figure 14:
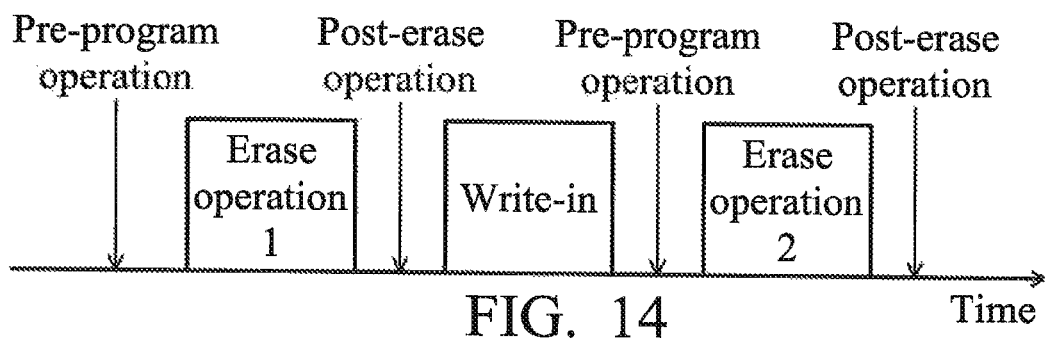
FIG. 14 is a block diagram illustrating an example of effect of the invention according to an embodiment.

In the flash memory, when programming data, a region where data is not programmed or a region where data is erased is prepared. In order not to speed up deterioration of a certain region, an algorithm tends to select a memory region in a way that makes numbers of times of program/erase even. FIG. 14 is a block diagram illustrating an example of alternately performing a programming operation and an erase operation on a certain block. That is, an erase operation 1 is performed on a block, then a programming (write-in) operation is performed on pages of the block, and after that, an erase operation 2 is performed on the block.

In the embodiment, when the erase operation 1 is performed on the block, a write-in operation prior to the erase operation (pre-program operation) is performed. The block may comprise a memory cell that has never been programmed or a memory cell whose number of times of programming is not relatively low. In the write-in operation prior to the erase operation, the initial value Vpgm_init of programming pulses of each page is consulted, and a programming voltage that is 2 or 3 step voltages higher than the initial value is applied to perform a programming operation of data "0" on all or most memory cells in the block. As shown in FIG. 2, a threshold value of a memory cell increases as the number of erase/program cycles increases. Therefore, threshold values of the memory cells in the block can be equalized or at least approximate by equalizing numbers of times of erase/program cycles.

When the erase operation 1 of the block ends, a write-in operation posterior to the erase operation (post-erase operation) is performed. In the write-in operation posterior to the erase operation, programming pulses and erase pulses are updated. As described above, when the number of times of erase pulses used when erasing the block increases (for example, as described above, when the number of times of erase pulses is increased from 2 to 3), the initial value of erase pulses is increased by one step voltage, such as the example shown in FIG. 10A. Therefore, in next erase operation of the block, the initial value of erase pulses is one step voltage higher than the initial value of erase pulses at this time. In addition, in the next erase operation of the block, the number of times of erase pulses is decreased to 2. Since the applying time of 2 erase pulses is less than the applying time of 3 erase pulses, deterioration of memory cells can be restrained.

Furthermore, in the write-in operation posterior to the erase operation, the initial value Vpgm_init of each page in the trimming codes stored in the register is used to perform a programming operation of trimming codes on each page in the spare region of the block, and whether the programming operation is easy for memory cells is determined on the basis of a verify voltage of Vt=0V. Regarding normal memory cells whose data holding characteristics are good, if the programming operation is not performed by using a pulse having the initial value Vpgm_init, data "0" will not appear. If data "0" appears on any one of word lines to which 8 bits of data "0" of the non-converted and converted code correspond, it is determined that the programming operation is easy, and thus an update is performed to decrease the initial value by one step voltage. Then. The updated trimming codes are written-in to the spare region by using normal ISPP.

When the erase operation 1 of the block ends, the block is ready for programming. When a programming operation is performed, a page is selected according to address information, and an initial value Vpgm_init of programming pulses stored in a spare region of the selected page is read out. The initial value Vpgm_init of programming pulses is formed and written-in to the spare region in the post-erase operation right posterior to the erase operation 1. The initial value Vpgm_init of programming pulses is updated data that reflects the programming status of the write-in operation posterior to the erase operation. The programming operation is performed on the selected page according to the read-out initial value Vpgm_init of programming pulses, and a verify operation is performed by using a verify voltage Verify=0V. Though the programming speed of the programming operation performed right after the erase operation tends to increase, data holding characteristics of memory cells would recover after a period of time from the erase operation to the programming operation passes. By using the initial value Vpgm_init of programming pulses which is the same as that of the post-erase operation, in the result of the verify operation performed by using the verify voltage Verify=0V, if any data "0" appears in the selected page, programming statuses of memory cells are determined to be easy. When programming pulses having large voltage values are provided after the second programming pulse, considering the rapid deterioration of the memory cells, programming pulse voltages after the second programming pulse are restrained (for example, as shown in FIG. 13A, 0.8V). On the other hand, if no data "0" appears in the selected page, considering the improvement in data holding characteristics of the memory cells, the second programming pulse voltage is relatively increased (for example, as shown in FIG. 13B, the second programming pulse voltage is increased by 1V).

After programming, an erase operation is performed again on the block. Here, the invention is not limited to a condition in which all pages in the block are programmed. In addition, the invention is also not limited to a condition in which one page comprises only data "0". In other words, in the block, data "1" and data "0" simultaneously exist. As described above, before an erase operation 2 of the block is performed, most data in the block is data "0" because of a write-in operation prior to the erase operation.

According to the embodiment described above, the invention provides a flash memory having high endurance. In the flash memory having high endurance, program/erase cycle characteristics are equalized, increase in the number of times of pulses is moderated, application of high voltages is restrained and partial deterioration of the number of times of data rewrites and data holding characteristics is prevented. In addition, appropriate programming voltages and/or erase voltages corresponding to the number of cycles are provided by monitoring the programming status before and after erasing.

While the invention has been described by way of example and in terms of preferred embodiment, it is to be understood that the invention is not limited thereto. To the contrary, it is intended to cover various modifications and similar arrangements (as would be apparent to those skilled in the art).

In the above embodiment, though one memory cell has one threshold value (single value), the invention is not limited thereto. For example, the invention also applies to a semiconductor memory in which a memory cell stores multiple-bit data such as 2-value or 4-value data. In addition, a skilled person in the art may easily know how to generate erase pulses according to known circuit technologies. The number of erase pulses, the erase voltages and the pulse width described above are only exemplary and can be appropriately modified according different designs of semiconductor memories. Moreover, in the above embodiment, though memory cells which use floating gates as charge accumulation layers are illustrated, the invention is not limited thereto. For example, the invention can also be applied to memory cells which use something other than floating gates as charge accumulation layers, such as an interface-trap type non-volatile memory which is similar to an oxide-film-nitride-film-oxide-film (ONO) type non-volatile memory.

What is claimed is:
1. A non-volatile semiconductor memory, comprising:
a memory array, comprising a plurality of memory cells arranged in a matrix form, wherein in a programming operation, the non-volatile semiconductor memory applies one or more than one programming pulse on a selected page of the memory array to program data to the selected page, wherein in an erase operation, the non-volatile semiconductor memory applies one or more than one erase pulse on a selected block of the memory array to erase data in the selected block, wherein the selected block includes a plurality of pages, and the selected page is one of the plurality of pages, wherein before the erase operation, the non-volatile semiconductor memory performs a pre-program operation, wherein after the erase operation, the non-volatile semiconductor memory performs a post-erase operation, wherein in the post-erase operation, the non-volatile semiconductor memory writes in voltage information relating to programming pulses of each page of the selected block and voltage information relating to erase pulses of the selected block to a predefined region in the selected block, wherein in the pre-program operation, the non-volatile semiconductor memory programs each page of the selected block according to voltage information relating to programming pulses which is stored in the predefined region, and wherein in the erase operation, the non-volatile semiconductor memory erases data in the selected block according to voltage information relating to erase pulses which is stored in the predefined region.

2. The non-volatile semiconductor memory as claimed in claim 1, wherein in the post-erase operation, the non-volatile semiconductor memory further updates the voltage information relating to programming pulses based on a verify result of programming each page of the selected block according to the voltage information relating to programming pulses and writes in the updated voltage information relating to programming pulses.

3. The non-volatile semiconductor memory as claimed in claim 2, wherein when a threshold value of any memory cell in the selected page is larger than a reference value, the non-volatile semiconductor memory updates the voltage information relating to programming pulses to decrease an initial value of programming pulses.

4. The non-volatile semiconductor memory as claimed in claim 2, wherein the voltage information relating to programming pulses comprises n bits of non-converted codes which are binary data indicating an initial value of programming pulses of each word line and n bits of converted codes which are converted from the non-converted codes, wherein when the non-converted codes and the converted codes are written-in to the predefined region, the non-volatile semiconductor memory verifies memory cells designated by binary data of the non-converted codes and the converted codes.

5. The non-volatile semiconductor memory as claimed in claim 1, wherein the non-volatile semiconductor memory updates the voltage information relating to erase pulses based on an amount of erase pulses in the erase operation and writes in the updated voltage information relating to erase pulses.

6. The non-volatile semiconductor memory as claimed in claim 5, wherein the non-volatile semiconductor memory determines whether the amount of erase pulses in the erase operation is larger than a predefined number, and when the amount of erase pulses in the erase operation is larger than the predefined number, the non-volatile semiconductor memory updates the voltage information relating to erase pulses to increase an initial value of erase pulses.

7. The non-volatile semiconductor memory as claimed in claim 1, wherein the non-volatile semiconductor memory obtains a minimum value of initial values of programming pulses of all pages in the selected block from the voltage information relating to programming pulses and uses a programming pulse which is equal to the minimum value incremented by a predefined voltage to program the selected block.

8. The non-volatile semiconductor memory as claimed in claim 1, wherein the non-volatile semiconductor memory reads out the voltage information relating to programming pulses and the voltage information relating to erase pulses stored in the predefined region and stores the read-out voltage information to a register at least during the erase operation.

9. A non-volatile semiconductor memory, comprising:
a memory array, comprising a plurality of memory cells arranged in a matrix form, wherein in a programming operation, the non-volatile semiconductor memory applies one or more than one programming pulse on a selected page of the memory array to program data to the selected page, and in an erase operation performed before the programming operation, the non-volatile semiconductor memory erases data in a selected block of the memory array; and
a storage unit, comprising a predefined region, wherein when the data in the selected block is erased, the predefined region is used to store voltage information relating to programming pulses of all pages in the selected block in the erase operation,
wherein in the programming operation, the non-volatile semiconductor memory reads out voltage information relating to programming pulses of the selected page from the predefined region, applies a first programming pulse according to the voltage information relating to programming pulses of the selected page, and then determines a voltage of a second programming pulse according to a verify result.

10. The non-volatile semiconductor memory as claimed in claim 9, wherein when a threshold value of any memory cell in the selected page is larger than a reference value, the voltage of the second programming pulse is V1, and when threshold values of all memory cells in the selected page are not larger than the reference value, the voltage of the second programming pulse is V2, wherein V1 is smaller than V2.

11. An erasing method, applied to a non-volatile semiconductor memory, wherein the non-volatile semiconductor memory comprises a memory array consisting of a plurality of memory cells arranged in a matrix form, wherein the erasing method comprises:
selecting a block comprising a plurality of pages according to an erase command and address information;
reading out, from a predefined region in the block, voltage information relating to programming pulses which are used when programming each page in the block;
performing a pre-program operation on each page in the block according to the voltage information relating to programming pulses;
erasing the block according to voltage information relating to erase pulses;
updating the voltage information relating to programming pulses and the voltage information relating to erase pulses according to predefined criteria; and
writing-in the updated voltage information relating to programming pulses and the updated voltage information relating to erase pulses to the predefined region in a post-erase operation.

12. The erasing method as claimed in claim 11, wherein updating the voltage information relating to programming pulses and the voltage information relating to erase pulses according to predefined criteria further comprises:

determining whether an amount of erase pulses used in erasing is larger than a predefined number, and when the amount of erase pulses is larger than the predefined number, updating the voltage information relating to erase pulses to increase an initial value of erase pulses.

13. The erasing method as claimed in claim 11, wherein updating the voltage information relating to programming pulses and the voltage information relating to erase pulses according to predefined criteria further comprises:

in a verification after performing a programming operation by using an initial value of programming pulses obtained from the voltage information relating to programming pulses, determining whether there is any memory cell whose threshold value is larger than a reference value in the selected page; and when there is a memory cell whose threshold value is larger than a reference value in the selected page, updating the voltage information relating to programming pulses to decrease an initial value of programming pulses.

14. The erasing method as claimed in claim 13, wherein the voltage information relating to programming pulses comprises n bits of non-converted codes which are binary data indicating an initial value of programming pulses of each word line and n bits of converted codes which are converted from the non-converted codes, and wherein the post-erase operation comprises:

when writing-in the non-converted codes and the converted codes to the predefined region, verifying memory cells designated by binary data of the non-converted codes and the converted codes.

15. The erasing method as claimed in claim 11, wherein the pre-program operation comprises:

obtaining a minimum value of initial values of programming pulses of all pages in the selected block from the voltage information relating to programming pulses, and using a programming pulse which is equal to the minimum value incremented by a predefined voltage to program the selected block.

16. A programming method, applied to a non-volatile semiconductor memory, wherein the non-volatile semiconductor memory comprises a memory array consisting of a plurality of memory cells arranged in a matrix form, wherein when data in a block of the memory array is erased, information relating to programming pulses which are used when programming a page in the book is stored to a predefined region, wherein the programming method comprises:

selecting a page according to a programming command and address information;

reading out the information form the predefined region;

applying a first programming pulse to the page according to the information;

verifying the page by using a predefined voltage; and determining a voltage of a second programming pulse according to a result of verifying the page by using the predefined voltage.

17. The programming method as claimed in claim 16, wherein when a threshold value of any memory cell in the selected page is larger than a reference value, the voltage of the second programming pulse is V1, and when threshold values of all memory cells in the selected page are not larger than the reference value, the voltage of the second programming pulse is V2, wherein V1 is smaller than V2.

* * * * *